United States Patent
Wu et al.

[11] Patent Number: 6,127,833
[45] Date of Patent: Oct. 3, 2000

[54] TEST CARRIER FOR ATTACHING A SEMICONDUCTOR DEVICE

[75] Inventors: Wen-Teng Wu, Chu-Bei; Chwei-Ching Chiu, Hsin-Chu; Chi-Min Hsieh, Kaohsiung, all of Taiwan

[73] Assignee: Taiwan Semiconductor Manufacturing Co., Hsin-Chu, Taiwan

[21] Appl. No.: 09/225,382

[22] Filed: Jan. 4, 1999

[51] Int. Cl.[7] .......................... G01R 31/02; G01R 31/26
[52] U.S. Cl. .......................... 324/755; 324/754; 324/765
[58] Field of Search ..................................... 324/755, 754, 324/765

[56] References Cited

U.S. PATENT DOCUMENTS

| | | | |
|---|---|---|---|
| 5,543,724 | 8/1996 | Christopher | 324/754 |
| 5,567,884 | 10/1996 | Dickinson et al. | 73/814 |
| 5,598,036 | 1/1997 | Ho | 257/738 |
| 5,731,709 | 3/1998 | Pastore et al. | 324/760 |
| 5,783,461 | 7/1998 | Hembree | 438/17 |
| 5,808,474 | 9/1998 | Hively et al. | 324/755 |
| 5,834,945 | 11/1998 | Akram et al. | 324/755 |
| 5,952,840 | 9/1999 | Farnworth | 324/755 |

*Primary Examiner*—Safet Metjahic
*Assistant Examiner*—James C Kerveros
*Attorney, Agent, or Firm*—George O. Saile; Stephen B. Ackerman

[57] ABSTRACT

A method for forming a semiconductor test carrier including an insulating substrate having a top surface, a bottom surface, periphery; with a rectangular cavity centrally located on the top surface and extending through to the bottom surface. A conductive ground trace formed on the top surface at the periphery of the cavity with conductive corner power traces formed adjacent each corner of the ground trace, with a ruled pattern of conductive wire bond pads encircling the corner power traces. Wire bond pads are formed in a linear array on each of the four sides encircling the power traces. A first interstitial ball pad array encircles the conductive wire bond pads and connects with the bottom surface by way of conductive vias communicating with a second interstitial ball pad array at the bottom surface. A glass plate is attached to the underside of the insulated substrate to form a bottom supporting surface in the rectangular cavity. A semiconductor device is placed in the cavity and its backside adhesively bonded to the glass plate. The appropriate input/output terminals of the device are connected to appropriate wire bond pads and traces on the top surface of the substrate with metallurgically bonded conductive wire. The exposed ends of the wires are encapsulated with a sealing polymer.

25 Claims, 4 Drawing Sheets

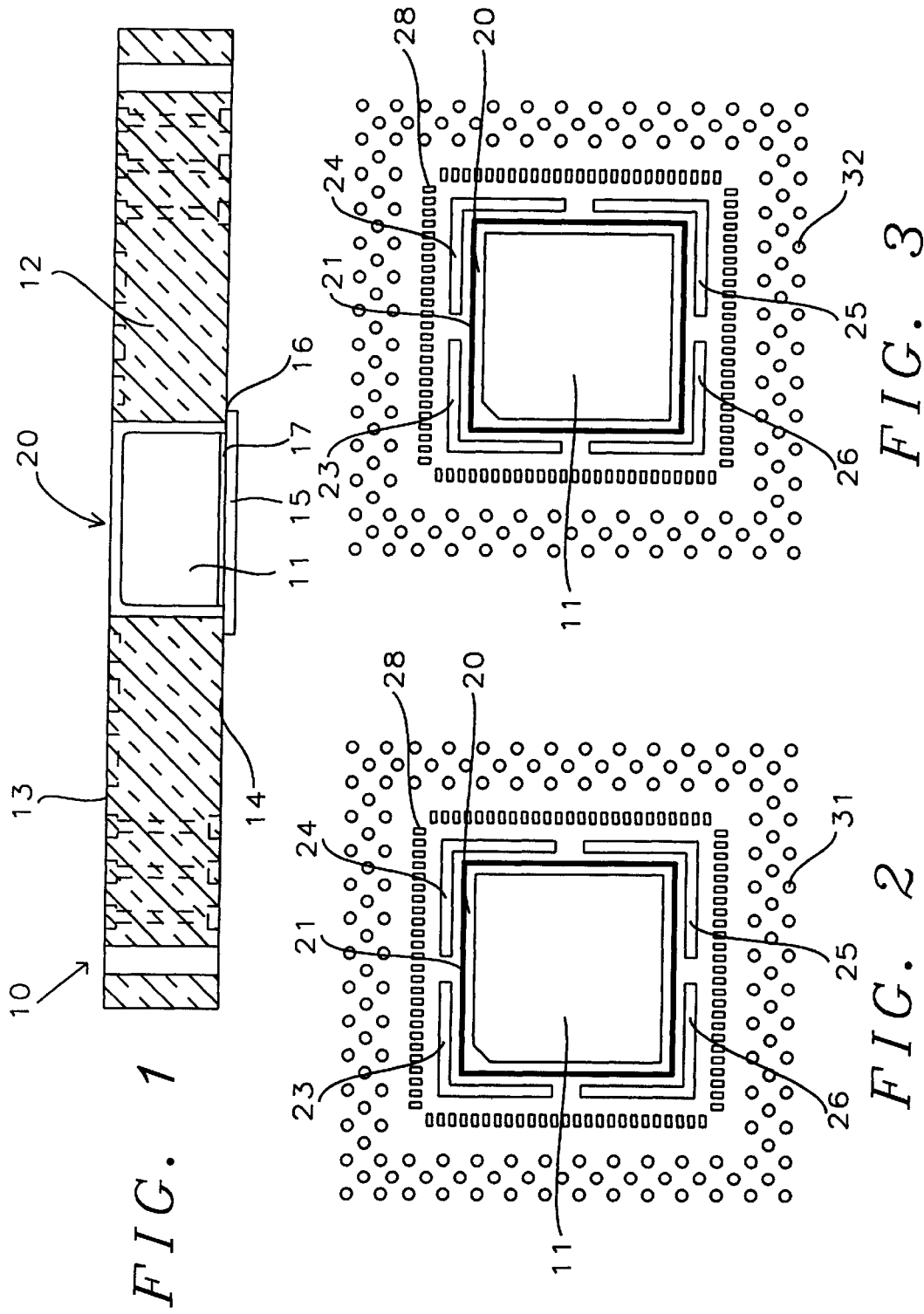

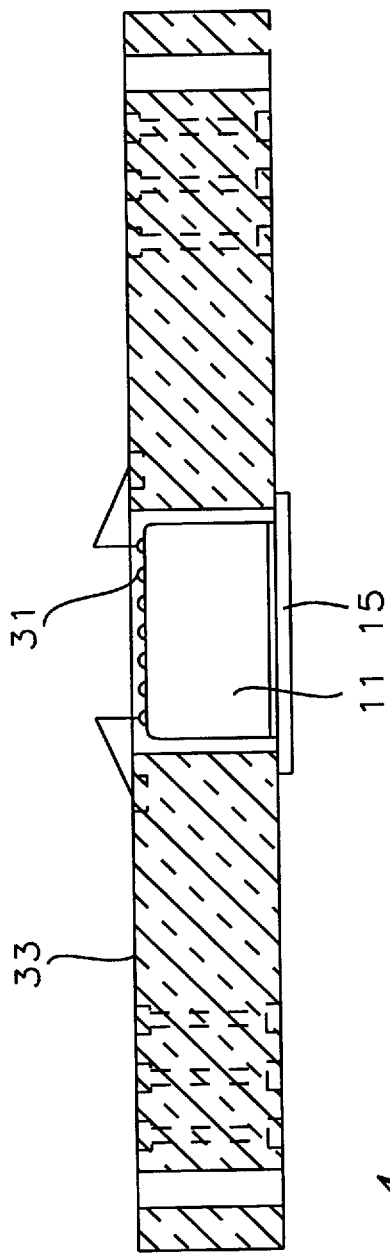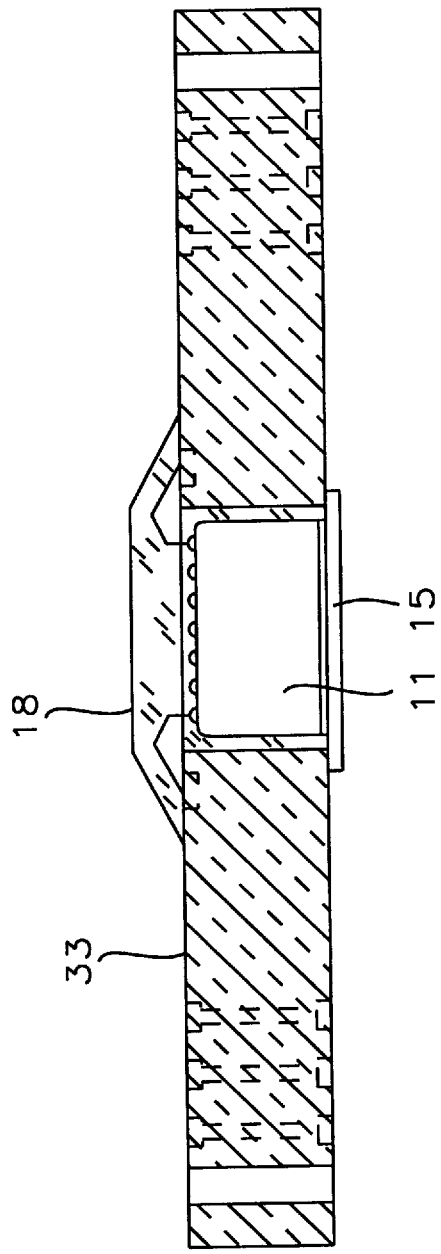

TEST CARRIER FOR ATTACHING A SEMICONDUCTOR DEVICE

BACKGROUND OF THE INVENTION (1) Technical Field

This invention relates to the general field of testing semiconductor devices, and more particularly, to a method for packaging a semiconductor chip in preparation for device testing during failure analysis.

(2) Description of the Prior Art

The following four documents relate to methods dealing with testing of integrated circuit devices.

U.S. Pat. No. 5,731,709 issued Mar. 24, 1998 to J. R. Pastore et al., shows methods and structures for testing a Ball Grid Array.

U.S. Pat. No. 5,783,461 issued Jul. 21, 1998 to D. R. Hembree discloses a temporary package for testing a semiconductor chip.

U.S. Pat. No. 5,567,884 issued Oct. 22, 1996 to G. T. Dickinson, shows a circuit board assemble torsion tester.

U.S. Pat. No. 5,598,036 issued Jan. 28, 1997 to T. H. Ho. shows a Ball Grid Array package.

The conductors used for interconnection within a semiconductor chip are extremely fine, being of the order of a few microns, or less, in width. The ability to construct such tiny conductors has made possible chips containing four to five orders of magnitude, and more, of interconnected components. This high level of integration has presented an enormous challenge, that is, at some point contact must be made between the chip and the external world where working to these tiny dimensions is not practical or even possible. The most widely used medium for connecting chips to one another and/or to the external world is a printed circuit board (PCB). The term PCB is used here in a general sense encompassing all types of printed circuit wiring, including what are known in the industry as cards and boards. The wiring on a PCB is much coarser than on a chip being typically measured in millimeters. It is not practical to connect a chip wiring directly to PCB wiring. An intermediate structure, capable of handling both ends of this wiring spectrum, is needed.

There are several types of these packages that include such rigid substrates as ceramics with straight-through vias, flexible polymer tape in tape automated bonding (TAB) with bumps or balls on either end, also, wafer-level assembly such as redistribution of peripheral I/Os to area array I/Os on chip and lead-on-chip (LOC).

Interconnections at the chip level were and are being achieved by wire bonding to plastic or ceramic single chip packages which are then bonded to printed wiring boards using surface mount technology (SMT). The trend is toward Flip Chip and Ball Grid Array (BGA) in the short term, and to direct-chip attach to the board in the long run. The board will be fabricated using fine line photolith via as contrast to drilled via in laminates and to photolith wiring on greensheets in ceramic boards.

The packaging technologies that span the microelectronics industry from consumer electronics to low-end systems to high-performance systems are very diverse. The number of chips needed to form a system in the past increased from a few, in consumer electronics, to several thousands, in supercomputers. Given this, the packaging hierarchical technologies necessary to interconnect all these chips become complex;

Semiconductor devices are presently supplied by chip manufacturers in die form, without wiring or electrical connection. A bare device in this configuration must be tested to assure a quality and reliability level prior to interconnection to a single level package. To certify a device as a good device the bare die must be tested and burned in. This has led to the development of temporary test carriers for performing burn in and testing of bare die. The temporary test carrier holds a single device and provides the electrical interconnection between the device and the device tester.

An improvement in packaging efficiency beyond ball grid arrays (BGAs) is being achieved by by so-called chip-scale of chip-size packages (CSP) which are hardly bigger than the chip itself. Similar to quad flat pack and BGA, CSP offers burn-in and testability of ICs prior to joining to the printed-wiring board. There are a number of types of these packages that include such rigid substrates as ceramics with straight-through vias, flexible polymer tape in tape automated bonding (TAB) with bumps or balls on either end, also, wafer-level assembly such as redistribution of peripheral I/Os to area array I/Os on chip and lead-on-chip.

The important parameters for developing a first-level package are numerous. In addition to supplying the required number of contacts for power and signal transmission, is arranging the desired number of wiring layers. Providing for thermal expansion compatibility with the chip, a thermal path for heat removal from the chip and to keep signal transmission delay and electrical noise to a minimum. Package sealing must ensure protection for both the package metallurgy and chip metallurgy. Minimum electrical delay requires a low dielectric constant. Low electrical noise requires low self-inductance's and low interline capacitance's and inductance's. Maximum heat removal requires high thermal conductivity. Maximum power distribution requires high electrical conductivity of package metallization, and high reliability requires a close thermal-expansion match between the chip and substrate.

The development cycle for first level packaging is extremely time consuming and costly. When the technology itself is developing in parallel, but on different time scales, resolution of the problems does not become easier. All of these issues are exacerbated by the continuing advance of VLSI and ultra large-scale integration (VLSI) technology, where exponential increases in the number of conductors are matched by its interconnected components making front and back-side failure analysis of the chip extremely important. It would be worthwhile to chip manufacturers if a quick and cost effective method was made available for preparing a new prototype chip sample with front and back side accessibility to do failure analysis.

SUMMARY OF THE INVENTION

It has been an object of the present invention to provide an improved test package for preparing new prototype chip samples for failure analysis including a semiconductor die and a modified printed circuit board to provide die mounting for test accessibility to both its top and bottom surfaces.

Another object of the present invention has been to provide a method to expedite prototype functional testing to reduce product time to market.

Still another object of the present invention has been to provide a method for fabricating the test package at a cost that is lower than that of other packages.

A further object of the invention has been to provide a method for mounting the device for back-side EMMI and front-side EMMI failure analysis.

These objects have been achieved by using a modified printed circuit board suitable for performing failure analysis of a semiconductor device. The circuit board includes an epoxy-glass substrate with a cavity which encircles the device to be tested and includes a plurality of wiring pads used for connecting to the device. A device receiving area is in the form of a rectangular opening extending from the top surface to the bottom surface of the circuit board. A transparent glass substrate is adhesive bonded along its edge periphery to the bottom edges of the opening. The chip is placed inside the cavity with its electrical connections facing upwards and releasably bonded, using a thermally conductive adhesive, to the surface of the glass substrate. Wiring contacts exist along the top peripheral portions of the device receiving area so that upon attaching the back-side of the chip to the glass substrate, a plurality of wires are used to connect the chip to the circuit board by metallurgically bonding one end to the conductive contacts on the chip and the other end bonded to the peripheral wiring bond fingers on the circuit board. A suitable polymer is deposited encapsulating the die and wire bond areas to protect the wire connections from potentially corrosive elements.

The above configuration permits both sides of the chip to be analyzed during failure analysis.

DESCRIPTION OF THE DRAWINGS

FIG. 1 is a schematic front cross-sectional view of the printed circuit board of the invention.

FIG. 2 is an enlarged and partial schematic top view of the printed circuit board of the invention.

FIG.3 is an enlarged and partial schematic bottom view of the printed circuit board of the invention.

FIG.4 is a schematic front cross-sectional view of a partially assembled printed circuit board of the invention FIG. 5 is an schematic front cross -sectional view of a fully assembled printed circuit board of the invention.

DETAILED DESCRIPTION OF THE PREFERRED EMBODIMENT

Figure 6:
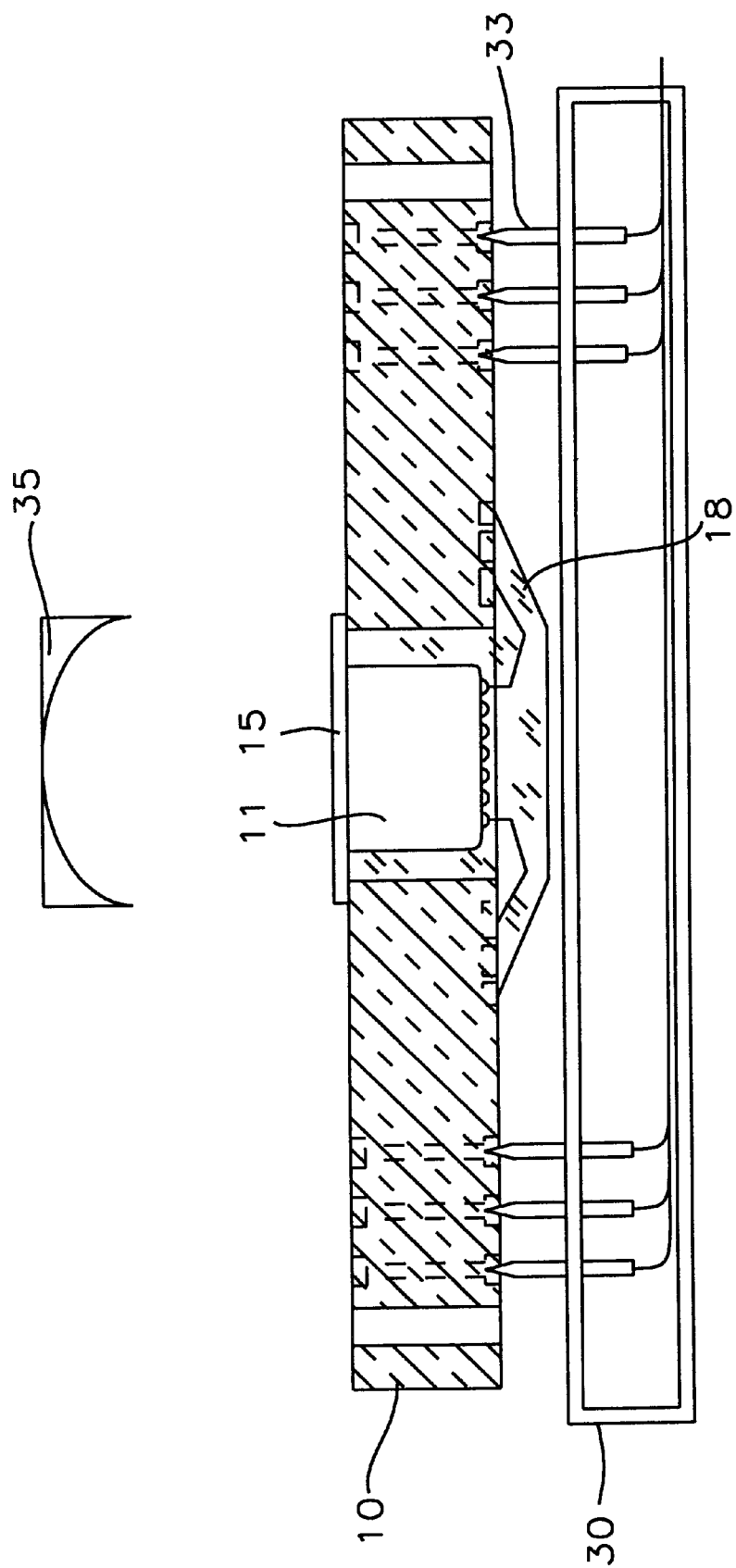
FIG. 6 is a schematic cross-sectional view, of the invention, showing the assembled printed circuit board in a position to analyze the back-side of the chip during failure analysis.

Referring now to FIG. 1 a schematic cross-section view of a semiconductor test carrier 10 constructed in accordance with the invention is shown. The test carrier 10 is adapted to retain a semiconductor device 11, to establish an electrical connection with the device 11 for the purposes of prototype functional testing and for failure analysis.

The test carrier 10, generally stated, includes an insulating substrate 12 having a top surface 13, a bottom surface 14, with a rectangular cavity 20 centrally located on the substrate and extending from the top surface through to the bottom surface. The insulating substrate 12 includes a conductive ground trace 21 (FIG. 2) formed on the top surface 13 at the periphery of the cavity 20. The ground trace is used for wire connections between the device and ground plane of the test carrier 10 to which it is mounted. Four L shaped conductive power traces 23, 24, 25, and 26 are formed adjacent each corner of the ground trace 21. The power traces are connected to the device through the use of wire bonds that eventually supplies power to the device.

A multiplicity of conductive wire bond fingers 28, form four ruling patterns extending corner to corner encircling and adjacent the corner power traces 23, 24, 25, and 26. Each of the conductive wire bond fingers, comprising the ruling patterns, have conductive traces (not shown) connecting to a first pattern of ball pads 31, formed in an interstitial array encircling the conductive wire bond pads 28 on the top surface 13. The first pattern of ball pads are in electrical communication with a second pattern of ball pads 32 formed in a matching interstitial array on the bottom surface 14 (FIG. 3) by way of conductive vias holes running through the substrate as illustrated in FIG. 1.

Still referring to FIG. 1 a glass plate 15 is affixed, with an adhesive 16, to the underside of the insulated substrate 12 to form a bottom supporting surface and device receiving area by closing the distal end of the rectangular cavity. A semiconductor device is placed with its backside into the cavity and releasably bonded to the glass plate. The bonding of the backside of the device to the glass plate is done with a die bond organic adhesive 17 filled with conductive metals to enhance heat transfer.

Referring now to FIGS. 4 and 5, the semiconductor device 11 exhibits a plurality of conductive bonding pads on its front side which serve as input/output terminals for the device. The device pads are connected to appropriate wire bond fingers and traces on the top surface of the substrate by routing and bonding conductive wires to appropriate terminals therebetween and establishing communication between the device and semiconductor device carrier. The wire bonds are typically made of gold or aluminum material and are bonded to the bonding pads and bonding fingers using conventional techniques Following the wire bonding packaging operation, all the interconnected wiring pads 11 and 28 are protected with a polymer encapsulant 18 to retard the deleterious effects of moisture from reaching the delicate surfaces of the circuit and wire bonded interconnects.

Figure 7:
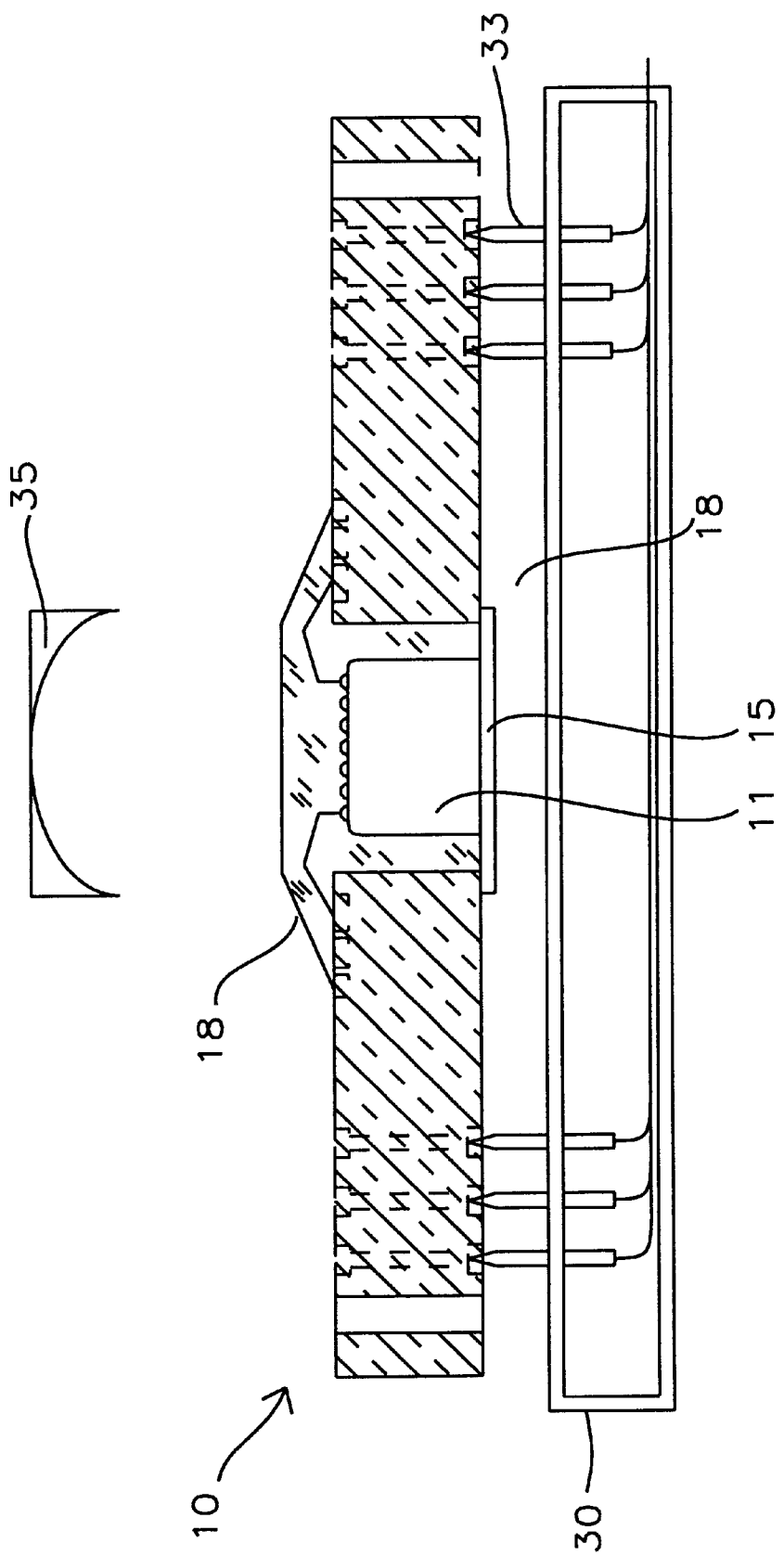
FIG. 7 is a schematic cross-sectional view, of the invention, showing the assembled printed circuit board in a position to analyze the front-side of the chip during failure analysis.

Referring now to FIGS. 6 and 7 which illustrate a fully assembled semiconductor device carrier 10. In FIG. 6, the assembled device carrier 10 is placed top-side down in electrical contact with a pin array 33 of a testing apparatus 30. The pin array 33 matches the interstitial array for both the first ball pad pattern 31 and the second ball pad pattern 32. This inverted position permits input power and test signals to be applied through the first ball pad pattern 31 for testing the device 11. An image sensor 35 shown placed overhead monitors and detects hot spots on the backside of the chip.

When using EMMI test equipment, the semiconductor device carrier 10 is inverted as shown in FIG. 7 placing the second ball pad pattern 32 in electrical contact with the pin array 33 of the testing apparatus 30, observation of the hot spots can now be monitored from the front side.

With VLSI becoming commonplace and IC density is still on the increase along with an increased number of metal layers, back-side failure analysis becomes extremely important. The ability to analyze each side of the device without major changes to either test equipment and device carrier is paramount. In addition, the structure of the invention can be applied to prototype functional test thereby reducing product time to market.

While the invention has been particularly shown and described with reference to the preferred embodiments thereof, it will be understood by those skilled in the art that various changes in form and details may be made without departing from the spirit and scope of the invention.

What is claimed is:

1. A semiconductor device test carrier comprising:
   a printed circuit board (CB) substrate having a top surface, a bottom surface, and periphery;
   a rectangular cavity centrally located on said top surface and extending through to said bottom surface;
   said cavity is concentric within a conductive ground trace patternly provided on the top surface of said PCB substrate;
   conductive corner power traces are provided adjacent each corner of said ground trace, and
   a ruled pattern of conductive wire bond fingers encircling said corner power traces are also provided in a linear array on each of four sides encircling said power traces;
   a first interstitial ball pad array encircling said conductive wire bond pads connects the bottom surface by way of conductive vias and communicates with a second interstitial ball pad array at the bottom surface;
   a glass plate fitted and bonded to the underside of said PCB substrate forms a transparent bottom supporting surface for said rectangular cavity;
   a semiconductor device with its backside bonded to said glass substrate within said cavity, bares both front and back sides of said device for EMMI failure analysis.

2. The device test carrier described in claim 1 further comprising:
   said semiconductor device having a plurality of bonding pads on its front side which serve as input/output terminals for said device;
   wires connected said bonding pads of said device to appropriate wire bond fingers and traces of said substrate , said connected wires encapsulated between said device and said device test carrier.

3. The device test carrier described in claim 1 wherein the material comprising said insulating substrate in taken from the group consisting of epoxy-glass based and phenolic based materials.

4. The device test carrier described in claim 2 wherein the material comprising said insulating substrate in taken from the group consisting of epoxy-glass based and phenolic based materials.

5. The device test carrier described in claim 1 wherein said ball pads are generally spherical shaped members configured for multiple electrical engagements with mating electrical connectors of a test apparatus.

6. The device test carrier described in claim 1 wherein the material comprising the ball pads is copper and plated with gold.

7. The device test carrier described in claim 2 wherein the material comprising the ball pads is copper plated with gold.

8. The device test carrier described in claim 2 wherein the outside dimensions of the glass plate are greater than the periphery dimensions of the cavity to permit bonding to the bottom surface of the insulating substrate.

9. The device test carrier described in claim 2 wherein the bonding material used for bonding the device die to the glass plate and the glass plate to the bottom of the insulating substrate is taken from the group of thermally conductive die adhesives consisting of resin type epoxy or polyimide with an oxide filler for enhancing heat transfer.

10. The device test carrier described in claim 2 wherein the encapsulating material used for sealing the wire connections is taken from the group of polymeric materials consisting of silicone elastomers, ultrasoft silicone gels, low-stress epoxies, low thermal-expansion coefficient and photodefinable polyimides and cyclobutenes.

11. The device test carrier described in claim 2 wherein functional testing of said semiconductor device is performed after encapsulation.

12. The device test carrier described in claim 1 wherein said first interstitial ball pad array situated on the top surface interconnects with said second interstitial ball pad array situated on the bottom surface thereby permitting power pluggability to an analysis test socket from either the top or bottom ball pad arrays.

13. The device test carrier described in claim 12 wherein reversible pluggability with an analysis test socket allows thermal sensing of both surfaces of said semiconductor device during failure analysis.

14. A method for forming a semiconductor device test carrier using a printed circuit board (PCB) comprising the steps of providing an off-the-shelf PCB to be modified to receive a semiconductor device, said PCB having a top surface, a bottom surface and periphery;
   machining a rectangular cavity centrally located on the top surface and extending through to the bottom surface, said rectangular cavity is positioned concentric and within a conductive ground trace patternly formed on the top surface of said PCB, with conductive corner power traces patternly formed adjacent each corner of said ground trace, and
   providing a ruling pattern of conductive wire bond pads encircling the corner power traces, said wire bond pads formed in a linear array on each of four sides encircling the power trace, and
   providing a first interstitial ball pad array encircling the conductive wire bond pads for connecting with the bottom surface by way of conductive vias communicating with a second interstitial ball pad array at the bottom surface, whereas each of said conductive wire bond fingers comprising said ruling pattern have conductive traces connected to said first pattern of ball pads to establish electrical communication between said conductive wire bond fingers and said first pattern of ball pads;
   providing and attaching a glass plate, with an adhesive, to the underside of the insulated substrate to form a transparent bottom supporting surface for the rectangular cavity;
   providing a semiconductor device having a front side, a back side and periphery;
   placing said device into cavity of said substrate and adhesively bonding its backside to the glass plate thereby baring both backside and frontside for EMMI failure analysis, said device showing a plurality of bonding pads on its front side which serve as input/output terminals for said device;
   providing conductive wire and wire bonder for connecting said bonding pads of said device to appropriate wire bond fingers and traces of said substrate; and
   providing an encapsulate for encapsulating all wire connections between said device and said device test carrier.

15. The method as described in claim 14 wherein the material comprising said insulating substrate in taken from the group consisting of epoxy-glass based and phenolic based materials.

16. The method as described in claim 14 wherein the material comprising said insulating substrate in taken from the group consisting of epoxy-glass based and phenolic based materials.

17. The method as described in claim 14 wherein said ball pads are generally spherical shaped members configured for multiple electrical engagements with mating electrical connectors of a test apparatus.

18. The method as described in claim 14 wherein the material comprising the ball pads is copper plated with gold.

19. The method as described in claim 14 wherein the material comprising the ball pads is copper plated with gold.

20. The method as described in claim 14 wherein the outside dimensions of the glass plate are greater than the periphery dimensions of the cavity to permit bonding to the bottom surface of the insulating substrate.

21. The method as described in claim 14 wherein the bonding material used for bonding the device die to the glass plate and the glass plate to the bottom of the insulating substrate is taken from the group of thermally conductive die adhesives consisting of resin type epoxy or polyimide with an oxide filler for enhancing heat transfer.

22. The method as described in claim 14 wherein the encapsulating material used for sealing the wire connections is taken from the group of polymeric materials consisting of silicone elastomers, ultrasoft silicone gels, low-stress epoxies, low thermal-expansion coefficient and photodefinable polyimides and cyclobutenes.

23. The method as described in claim 14 wherein functional testing of said semiconductor device is performed after encapsulation.

24. The method as described in claim 14 wherein said first interstitial ball pad array situated on the top surface interconnects with said second interstitial ball pad array situated on the bottom surface thereby permitting power pluggability to an analysis test socket from either the top or bottom ball pad arrays.

25. The method as described in claim 24 wherein power pluggability to an analysis test socket allows visual access for thermal sensing for both the top and bottom surfaces of said semiconductor device during failure analysis.

* * * * *